US012800492B2

(12) United States Patent

Ando et al.

(10) Patent No.: US 12,800,492 B2

(45) Date of Patent: Nov. 17, 2026

(54) LIGHT SOURCE AND AUTOMATIC ANALYZER

(71) Applicant: HITACHI HIGH-TECH CORPORATION, Tokyo (JP)

(72) Inventors: Takahiro Ando, Tokyo (JP); Yasuhiro Keta, Tokyo (JP); Yuya Matsuoka, Tokyo (JP); Shohei Arita, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 458 days.

(21) Appl. No.: 18/571,316

(22) PCT Filed: Jun. 15, 2022

(86) PCT No.: PCT/JP2022/023887

§ 371 (c)(1),
(2) Date: Dec. 18, 2023

(87) PCT Pub. No.: WO2023/276659

PCT Pub. Date: Jan. 5, 2023

(65) Prior Publication Data

US 2024/0280485 A1 Aug. 22, 2024

(30) Foreign Application Priority Data

Jul. 2, 2021 (JP) ................................ 2021-110501

(51) Int. Cl.

*B01L 3/00* (2006.01)
*B01D 15/08* (2006.01)
(Continued)

(52) U.S. Cl.

CPC ............. *G01N 21/59* (2013.01); *G01N 21/01* (2013.01); *H10W 90/00* (2026.01); *G01N 35/025* (2013.01)

(58) Field of Classification Search

CPC ...... G01N 21/59; G01N 21/01; G01N 35/025; G01N 2021/3181; G01N 2201/062;
(Continued)

(56) References Cited

U.S. PATENT DOCUMENTS

| | | | |
|---|---|---|---|
| 2009/0206758 | A1 | 8/2009 | Kobilke |
| 2012/0007076 | A1 | 1/2012 | Cho |

(Continued)

FOREIGN PATENT DOCUMENTS

| | | | |
|---|---|---|---|
| CN | 203118989 | U | 8/2013 |
| CN | 105470165 | A | 4/2016 |

(Continued)

OTHER PUBLICATIONS

First Office Action, issued Mar. 28, 2026, for Chinese Application No. 202280040734.5 (with English translation).

(Continued)

*Primary Examiner* — Oyeleye Alexander Alabi

(74) *Attorney, Agent, or Firm* — Baker Botts L.L.P.

(57) ABSTRACT

There is provided a light source and an automatic analyzer, which stabilize an amount of light while covering a wide wavelength band used in the automatic analyzer.

The light source of the present invention includes a substrate, a first LED provided on the substrate, and a phosphor that converts an excitation light of the first LED into a broadband light, in which the temperature sensor is embedded in the phosphor together with the first LED. Further, the automatic analyzer of the present invention includes an absorbance measuring unit having this light source, and a reaction disk on which a reaction vessel for containing a reaction solution measured by the absorbance measuring unit is mounted.

7 Claims, 8 Drawing Sheets

(51) Int. Cl.

| | |
|---|---|
| *B01F 33/302* | (2022.01) |
| *B01F 33/3033* | (2022.01) |
| *B01J 8/00* | (2006.01) |
| *B01J 8/02* | (2006.01) |
| *B01J 20/285* | (2006.01) |
| *B01J 20/287* | (2006.01) |
| *B01J 20/32* | (2006.01) |
| *B01L 7/00* | (2006.01) |
| *B01L 9/00* | (2006.01) |
| *B65G 47/80* | (2006.01) |
| *B82Y 20/00* | (2011.01) |
| *B82Y 30/00* | (2011.01) |
| *B82Y 40/00* | (2011.01) |
| *C08L 5/08* | (2006.01) |
| *C12M 1/34* | (2006.01) |
| *C12M 3/06* | (2006.01) |
| *C12N 1/14* | (2026.01) |
| *C12N 1/20* | (2026.01) |
| *C12Q 1/02* | (2006.01) |
| *C12Q 1/6806* | (2018.01) |
| *C12Q 1/6844* | (2018.01) |
| *C12Q 1/6848* | (2018.01) |
| *C12Q 1/6851* | (2018.01) |
| *C12Q 1/686* | (2018.01) |
| *G01K 1/14* | (2021.01) |
| *G01N 1/44* | (2006.01) |
| *G01N 15/10* | (2024.01) |
| *G01N 15/14* | (2024.01) |
| *G01N 15/1433* | (2024.01) |
| *G01N 21/01* | (2006.01) |
| *G01N 21/03* | (2006.01) |
| *G01N 21/05* | (2006.01) |
| *G01N 21/29* | (2006.01) |
| *G01N 21/33* | (2006.01) |
| *G01N 21/35* | (2014.01) |
| *G01N 21/59* | (2006.01) |
| *G01N 21/65* | (2006.01) |
| *G01N 21/75* | (2006.01) |
| *G01N 21/77* | (2006.01) |
| *G01N 27/07* | (2006.01) |
| *G01N 27/28* | (2006.01) |
| *G01N 27/416* | (2006.01) |
| *G01N 30/02* | (2006.01) |
| *G01N 30/60* | (2006.01) |
| *G01N 30/72* | (2006.01) |
| *G01N 31/10* | (2006.01) |
| *G01N 31/12* | (2006.01) |
| *G01N 33/543* | (2006.01) |
| *G01N 33/557* | (2006.01) |
| *G01N 33/564* | (2006.01) |
| *G01N 33/574* | (2006.01) |
| *G01N 33/575* | (2026.01) |
| *G01N 33/57515* | (2026.01) |
| *G01N 33/58* | (2006.01) |
| *G01N 33/68* | (2006.01) |
| *G01N 33/72* | (2006.01) |
| *G01N 35/00* | (2006.01) |
| *G01N 35/02* | (2006.01) |
| *H05B 45/10* | (2020.01) |
| *H10W 90/00* | (2026.01) |

(58) Field of Classification Search

CPC ... G01N 2201/0624; G01N 2201/0627; G01N 21/253; G01N 21/255; G01N 2035/0439; H10W 90/00; H10H 20/8514

See application file for complete search history.

(56) References Cited

U.S. PATENT DOCUMENTS

| | | | | |
|---|---|---|---|---|
| 2015/0002023 | A1 * | 1/2015 | Imangholi .............. | H05B 45/18 315/129 |
| 2015/0144983 | A1 | 5/2015 | Feichtinger et al. | |
| 2016/0093519 | A1 | 3/2016 | Higashi et al. | |
| 2017/0054110 | A1 | 2/2017 | Racz et al. | |
| 2020/0168593 | A1 | 5/2020 | Sun et al. | |
| 2021/0381954 | A1 | 12/2021 | Kawamura et al. | |
| 2022/0397581 | A1 | 12/2022 | Ando et al. | |
| 2026/0009808 | A1 | 1/2026 | Ando et al. | |

FOREIGN PATENT DOCUMENTS

| | | | | |
|---|---|---|---|---|
| CN | 211404524 | U | 9/2020 | |
| JP | 2007-287962 | A | 11/2007 | |
| JP | 2009-521077 | A | 5/2009 | |
| JP | 2012-094842 | A | 5/2012 | |
| JP | 2015-517740 | A | 6/2015 | |
| JP | 2017-515310 | A | 6/2017 | |
| JP | 2019-018441 | A | 2/2019 | |
| JP | 2020-087974 | A | 6/2020 | |
| JP | 2021-081312 | A | 5/2021 | |
| WO | WO-2021100349 | A1 * | 5/2021 | ............. G01N 21/33 |

OTHER PUBLICATIONS

Partial Supplementary European Search Report, mailed May 19, 2025, for European Application No. 22832814.2.

International Search Report, mailed Sep. 6, 2022, for International Application No. PCT/JP2022/023887.

* cited by examiner

[FIG. 1]
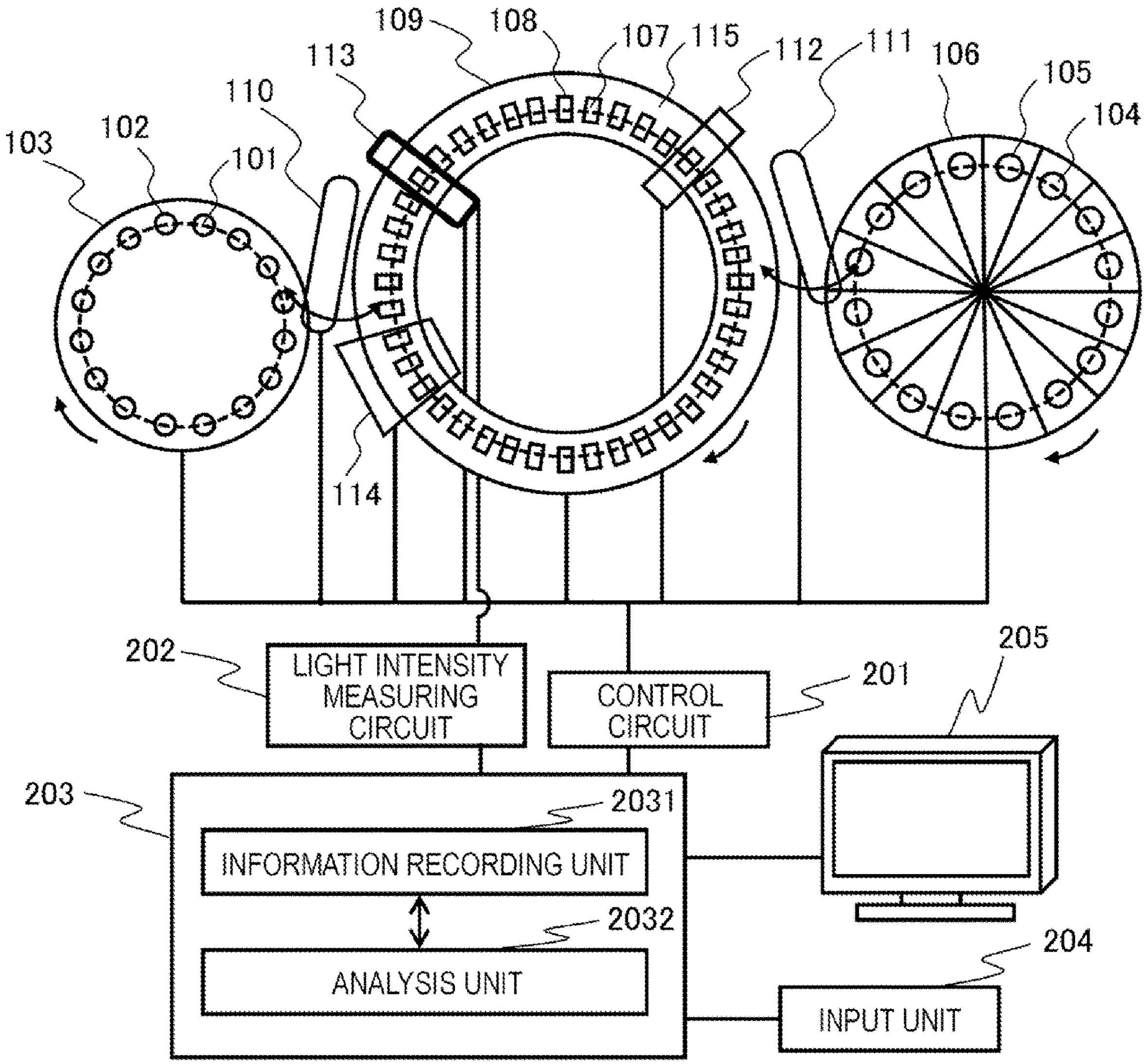

[FIG. 2]
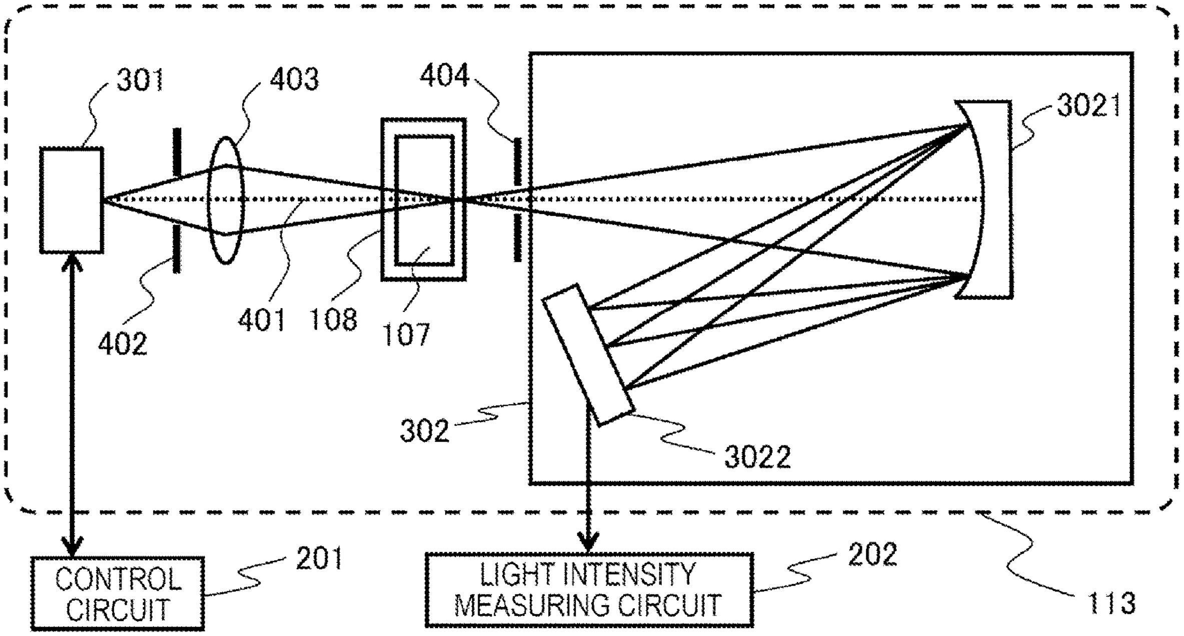

[FIG. 3]
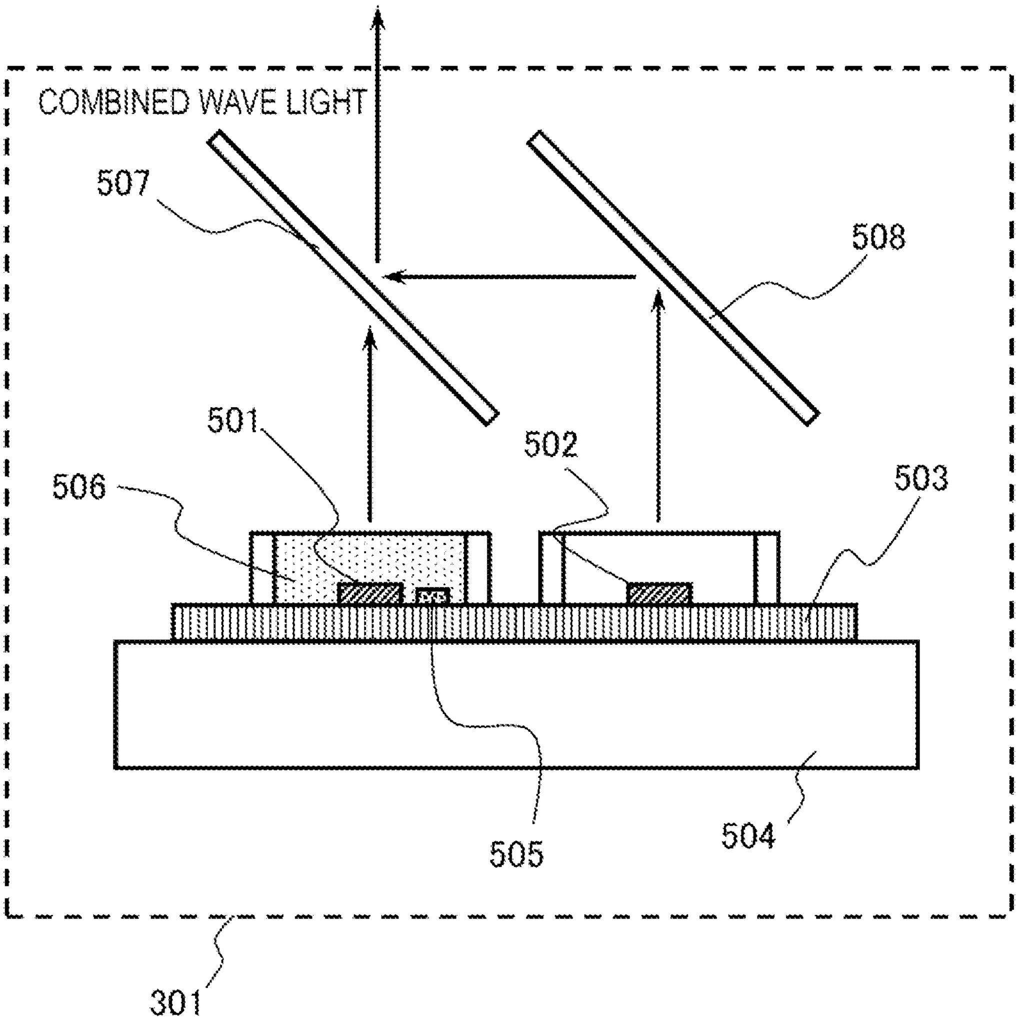

[FIG. 4]
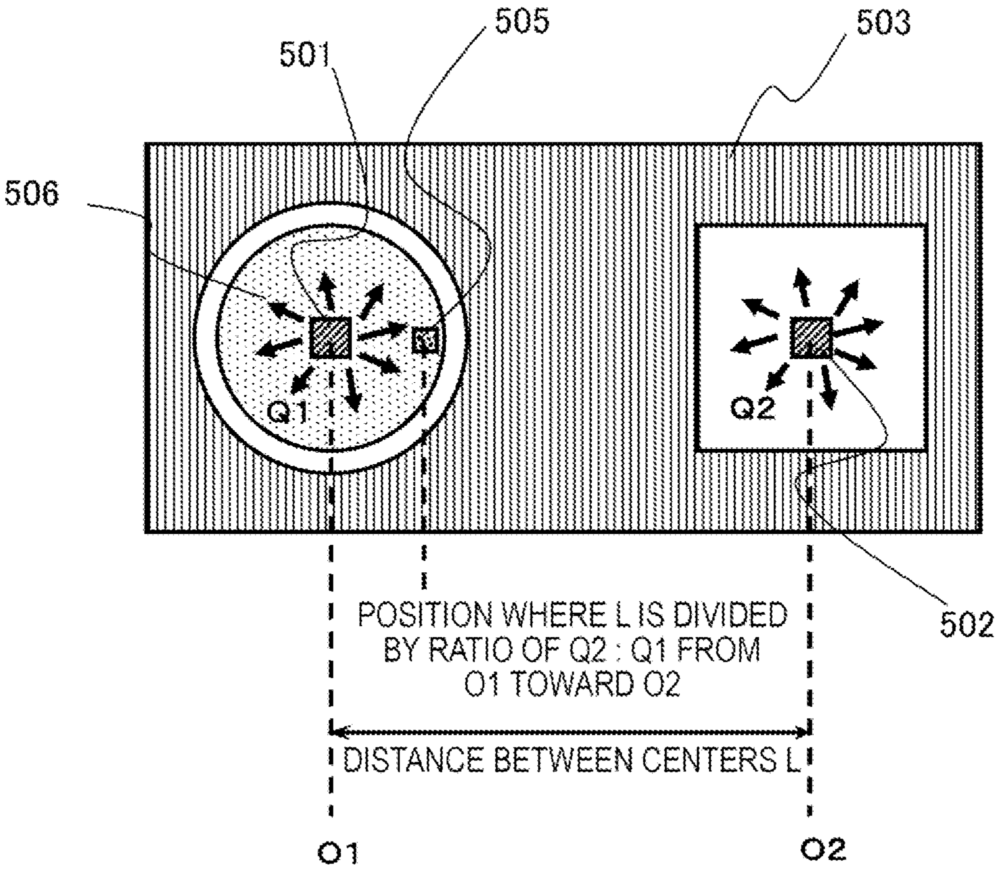

[FIG. 5]
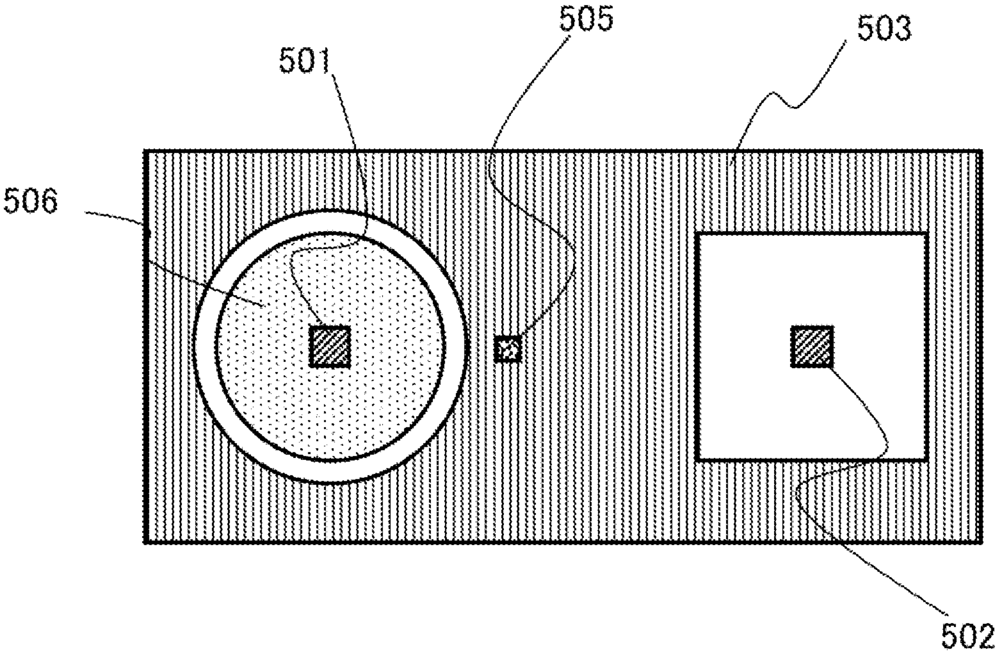
[FIG. 6]
| | LIGHT INTENSITY STABILIZATION TIME |
|---|---|
| COMPARATIVE EXAMPLE | 22 MINUTES |
| FIRST EMBODIMENT | 12 MINUTES |

[FIG. 7]
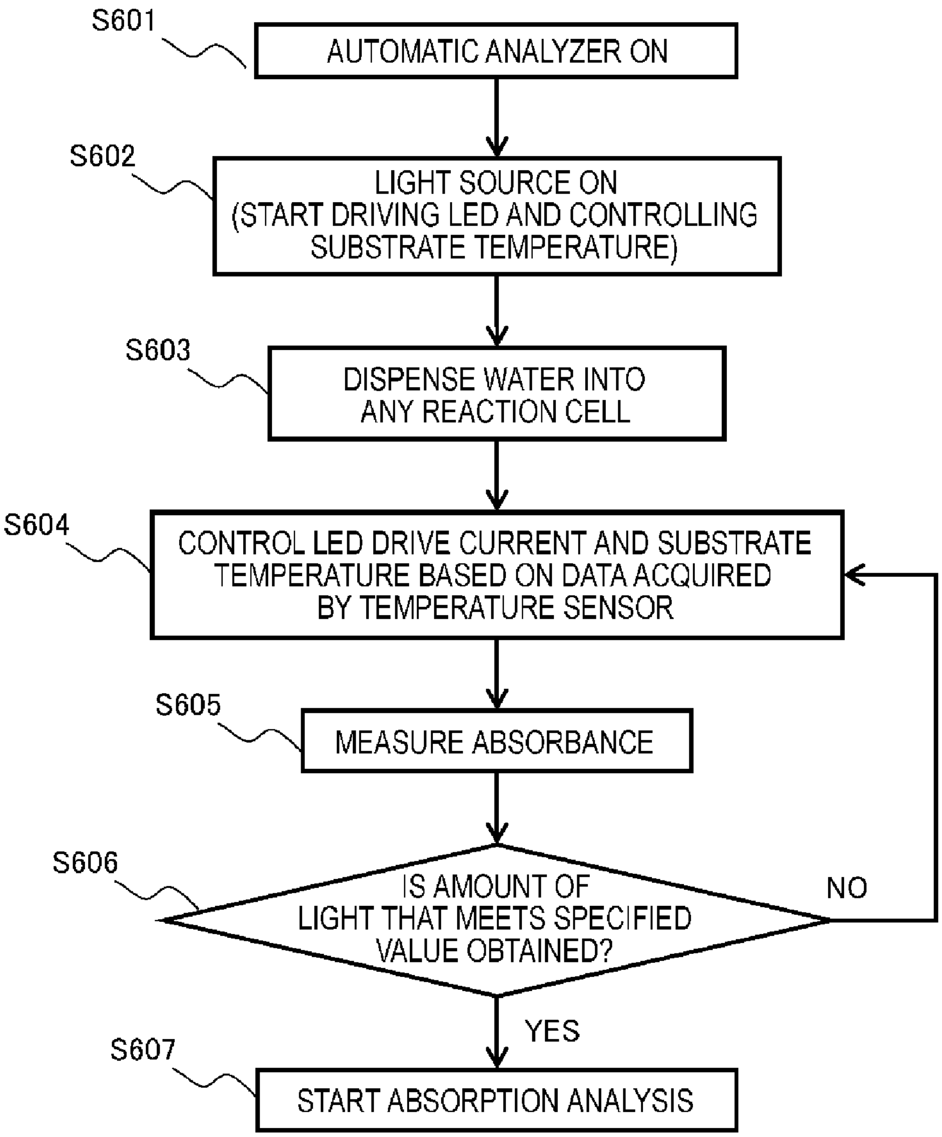

[FIG. 8]
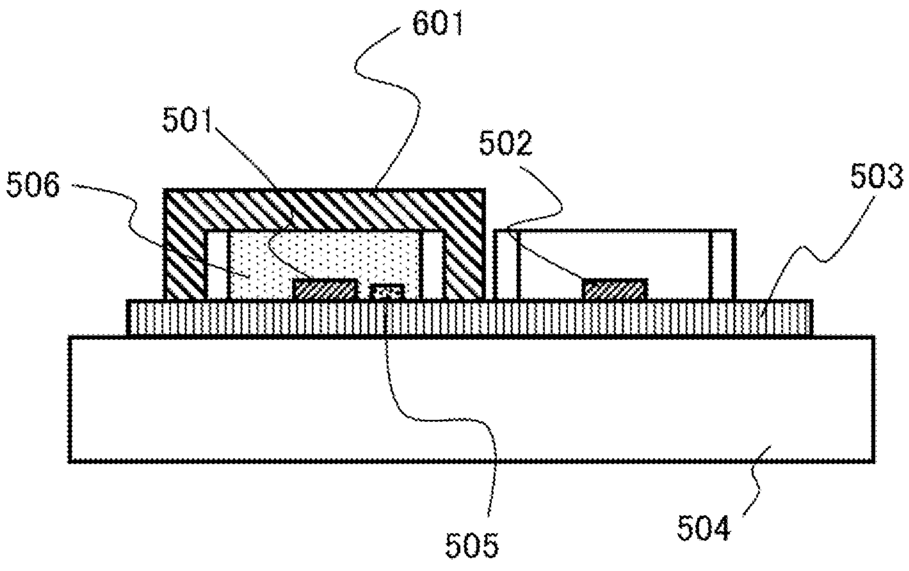

[FIG. 9]
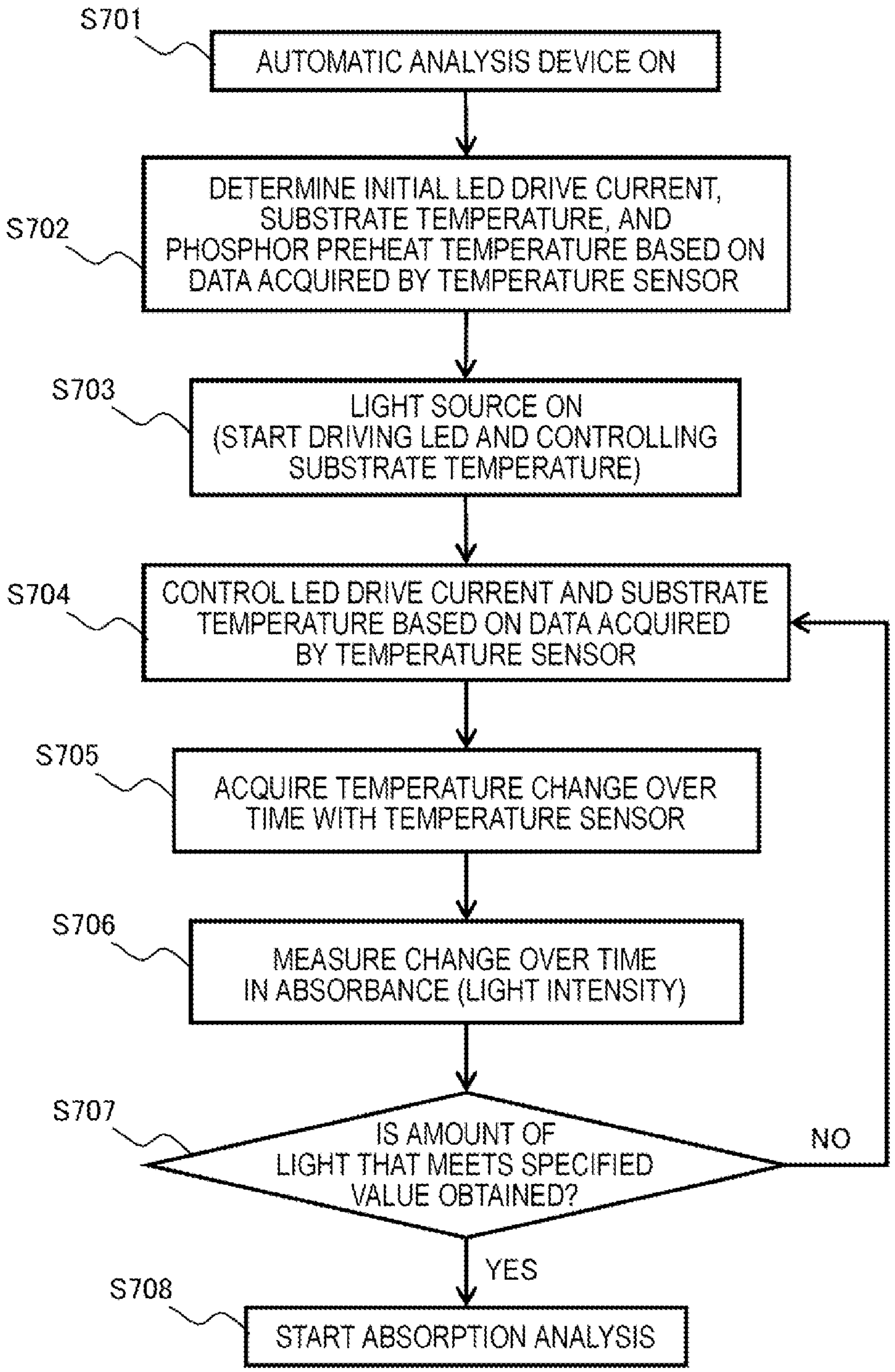

LIGHT SOURCE AND AUTOMATIC ANALYZER

TECHNICAL FIELD

The present invention relates to a light source and an automatic analyzer using the light source.

BACKGROUND ART

In automatic analyzers used to analyze component amounts contained in biological samples such as blood and urine, it is common to dispense samples and reagents into a liquid-containing vessel and analyze test items based on changes in optical properties like absorbance. In absorbance analysis of the automatic analyzer, a method of finding component amounts is used in which light from a light source is irradiated onto a sample or a reaction solution mixed with the sample and the reagent, the transmittance of the light at a single or a plurality of measurement wavelengths that have passed through the sample or reaction solution is measured by a light receiving element, the absorbance is calculated, and a component amount is determined from the relationship between absorbance and concentration.

Conventionally, light sources for absorbance analysis include xenon lamps and halogen lamps. However, these lamps take about 30 minutes to stabilize in the amount of light, and the lamps have a relatively short lifespan, resulting in frequent maintenance for the automatic analyzer. Therefore, light emitting diodes (LEDs), which are expected to have a long lifespan, have been considered as light sources for absorbance analysis in recent years.

However, the reagent and the wavelength of light used in the automatic analyzer vary depending on the component to be measured, and the wavelength range is broad, from 340 nm to 800 nm. Therefore, it is difficult to cover the entire wavelength band with light from a single LED, and it is conceivable to use a plurality of LED elements or to use a phosphor that converts the excitation light from the LED into broadband light. An example of a light source using a phosphor is disclosed in PTL 1, which includes a first LED chip that emits a light flux of a first wavelength band, a phosphor provided on the light flux of the first LED chip, and a second LED chip that emits a light flux of a second wavelength band.

CITATION LIST

Patent Literature

Patent Literature 1: Japanese Unexamined Patent Application Publication No. 2020-87974

SUMMARY OF INVENTION

Technical Problem

Here, to achieve the light intensity stability required for absorbance analysis in the automatic analyzer using LED light sources, it is important to suppress changes in the amount of light due to self-heating during LED lighting and ambient temperature. However, in light sources using phosphors as disclosed in PTL 1, although the LED chip itself is relatively easy to control at a stable temperature, controlling the temperature of the surrounding phosphor is difficult. When the temperature of the phosphor changes, the amount of light emitted from the phosphor also changes, making it not easy to stabilize the amount of light of a wide wavelength band used in the automatic analyzer.

There is provided a light source and an automatic analyzer, which stabilize an amount of light while covering a wide wavelength band used in the automatic analyzer.

Solution to Problem

To achieve the above objectives, the light source of the present invention includes a substrate, a first LED provided on the substrate, and a phosphor that converts an excitation light of the first LED into a broadband light, in which the temperature sensor is embedded in the phosphor together with the first LED.

Advantageous Effects of Invention

According to the present invention, it is possible to provide a light source and an automatic analyzer, which stabilize an amount of light while covering a wide wavelength band used in the automatic analyzer. Objects, configurations, and effects other than the above will be apparent from the description of the following embodiments.

BRIEF DESCRIPTION OF DRAWINGS

FIG. 1 is a schematic view illustrating an overall configuration of an automatic analyzer.

FIG. 2 is a diagram illustrating a configuration of an absorbance measuring unit that performs absorbance analysis of the automatic analyzer.

FIG. 3 is a cross-sectional view illustrating a configuration of a light source according to a first embodiment.

FIG. 4 is a plan view illustrating an example of an arrangement of temperature sensors.

FIG. 5 is a plan view illustrating an arrangement of temperature sensors in a light source of a comparative example.

FIG. 6 is a table illustrating a result of measuring the time from a lighting of a LED to a stabilization of the light amount drift.

FIG. 7 is a flowchart illustrating an example of a procedure for stabilizing an amount of light in the light source according to the first embodiment.

FIG. 8 is a cross-sectional view illustrating a configuration of a light source according to a second embodiment.

FIG. 9 is a flowchart illustrating an example of a procedure for stabilizing an amount of light in the light source according to the second embodiment.

DESCRIPTION OF EMBODIMENTS

In the following, the embodiments of the present invention will be described with reference to the drawings.

FIG. 1 is a schematic view illustrating an overall configuration of an automatic analyzer. The automatic analyzer according to the present embodiment includes three types of disks: a sample disk 103, a reagent disk 106, and a reaction disk 109, a dispensing mechanism that moves samples and reagents between these disks, a control circuit 201 that controls the disks and the dispensing mechanism, a light intensity measuring circuit 202 that measures the absorbance of the reaction solution, a data processing unit 203 that processes data measured by the light intensity measuring circuit 202, an input unit 204, which is an interface with the data processing unit 203, and an output unit 205. Furthermore, the dispensing mechanism includes a sample dispensing mechanism 110 and a reagent dispensing mechanism 111.

The data processing unit 203 includes the information recording unit 2031 and an analysis unit 2032. An information recording unit 2031 stores control data, measurement data, data used for data analysis, analysis result data, and the like. The data processing unit 203 may be realized using a computer. The computer includes at least a processor such as a CPU (Central Processing Unit) and the information recording unit 2031. The processing of the analysis unit 2032 may be realized by storing program codes corresponding to their data processing in the information recording unit 2031, and the processor executing each program code.

The input unit 204 and the output unit 205 input and output data with the information recording unit 2031. The input unit 204 is an information input device such as a keyboard, touch panel, and numeric keypad. The output unit 205 is a device for the user of the automatic analyzer to check the analysis results, for example, a display.

On the circumference of the sample disk 103, a plurality of sample cups 102 (sample vessels) containing samples 101 is disposed. The sample 101 is, for example, blood. On the circumference of the reagent disk 106, a plurality of reagent bottles 105 (reagent vessels) containing reagents 104 is disposed. On the circumference of the reaction disk 109, a plurality of reaction cells 108 (reaction vessels) containing a reaction solution 107 mixed with the sample 101 and the reagent 104 is mounted.

The sample dispensing mechanism 110 is a mechanism used to move a fixed amount of sample 101 from the sample cup 102 to the reaction cell 108. The sample dispensing mechanism 110, for example, includes a nozzle that discharges or aspirates a solution, a robot that positions and transports the nozzle to a predetermined position, a pump that discharges or aspirates a solution from/to the nozzle, and a flow path connecting the nozzle to the pump.

The reagent dispensing mechanism 111 is a mechanism used to move a fixed amount of reagent 104 from the reagent bottle 105 to the reaction cell 108. The reagent dispensing mechanism 111, for example, also includes the nozzle that discharges or aspirates a solution, the robot that positions and transports the nozzle to a predetermined position, the pump that discharges or aspirates a solution from/to the nozzle, and the flow path connecting the nozzle to the pump.

The stirrer 112 is a mechanism that stirs and mixes the sample 101 and the reagent 104 in the reaction cell 108. The cleaning unit 114 is a mechanism that discharges the reaction solution 107 from the reaction cell 108 after the analysis process is completed and then cleans the reaction cell 108. After cleaning, a new sample 101 is dispensed from the sample dispensing mechanism 110 into the reaction cell 108, and a new reagent 104 is dispensed from the reagent dispensing mechanism 111 for another reaction process.

In the reaction disk 109, the reaction cells 108 are immersed in a constant temperature fluid 115 in a constant temperature bath whose temperature and flow rate are controlled. Therefore, the temperatures of the reaction cell 108 and the reaction solution 107 inside the reaction cell 108 are kept constant by the control circuit 201 during the movement of the reaction disk 109. For the constant temperature fluid 115, water or air, for example, is used.

At a part of the circumference of the reaction disk 109, an absorbance measuring unit 113 (spectrophotometer) that performs absorbance analysis in the automatic analyzer is disposed.

FIG. 2 is a diagram illustrating a configuration of an absorbance measuring unit that performs absorbance analysis of the automatic analyzer. Light emitted from the light source 301 for absorbance analysis is emitted along an optical axis 401 and is condensed by a condensing lens 403 and irradiated onto the reaction cell 108. At this time, the width of the light emitted from the light source 301 is sometimes restricted by disposing a light source side slit 402 in order to uniformize the distribution of the amount of light in the irradiated plane.

The light that passes through the reaction solution 107 in the reaction cell 108 is spectrally dispersed by a diffraction grating 3021 in a spectrometer 302 and received by a detector array 3022, which has a plurality of light receivers. At this time, light that has not passed through the reaction solution 107 can become noise. Therefore, to prevent such stray light from entering the spectrometer 302, a slit 404 on the side of the spectrometer may be disposed.

The measurement wavelengths received by the detector array 3022 include, for example, 340 nm, 376 nm, 405 nm, 415 nm, 450 nm, 480 nm, 505 nm, 546 nm, 570 nm, 600 nm, 660 nm, 700 nm, 750 nm, 800 nm, and the like. The received signals from these light receivers are transmitted to the information recording unit 2031 of the data processing unit 203 through the light intensity measuring circuit 202.

The procedure for calculating the amount of components such as proteins, sugars, and lipids contained in the sample 101 is as follows: First, the control circuit 201 instructs the cleaning unit 114 to clean the reaction cell 108. Subsequently, the control circuit 201 dispenses a fixed amount of the sample 101 from the sample cup 102 to the reaction cell 108 using the sample dispensing mechanism 110. Subsequently, the control circuit 201 dispenses a fixed amount of the reagent 104 from the reagent bottle 105 to the reaction cell 108 using the reagent dispensing mechanism 111.

When dispensing each solution, the control circuit 201 rotates the sample disk 103, the reagent disk 106, and the reaction disk 109 using corresponding drive units. During this, the sample cup 102, the reagent bottle 105, and the reaction cell 108 are positioned at predetermined dispensing positions according to the drive timing of their corresponding dispensing mechanisms.

Subsequently, the control circuit 201 controls the stirrer 112 to mix the sample 101 and the reagent 104 dispensed into the reaction cell 108, creating the reaction solution 107. By rotating the reaction disk 109, the reaction cell 108 containing the reaction solution 107 passes through the measurement position where the absorbance measuring unit 113 is located. Each time it passes the measurement position, the amount of light transmitted from the reaction solution 107 is measured through the absorbance measuring unit 113. The measurement data are sequentially output to the information recording unit 2031 and stored as reaction process data.

During the accumulation of this reaction process data, if necessary, another reagent 104 can be additionally dispensed into the reaction cell 108 using the reagent dispensing mechanism 111, stirred by the stirrer 112, and measured for a certain period. As a result, reaction process data obtained at regular intervals are stored in the information recording unit 2031.

First Embodiment

The detail of the light source 301 used in the absorbance measuring unit 113 will be described. FIG. 3 is a cross-sectional view illustrating a configuration of a light source according to a first embodiment. As illustrated in FIG. 3, the light source 301 according to the present embodiment includes a substrate 503, a temperature adjusting unit 504 that adjusts the temperature of this substrate 503, a first LED 501 and a second LED 502 mounted on the side opposite to this temperature adjusting unit 504 with respect to the substrate 503.

Here, as an absorbance analysis method for an automatic analyzer, there is a two-wavelength measurement method that accurately quantifies the concentration of the measurement target by measuring light of two wavelengths at the same time. In this measurement method, the more common the light intensity fluctuation characteristics of each wavelength, the higher the quantitativeness. Therefore, according to the present embodiment, by mounting a plurality of LEDs on a single substrate 503 as illustrated in FIG. 3, each LED has similar temperature fluctuation characteristics due to the temperature control of the temperature adjusting unit 504, realizing high-precision absorbance analysis.

The first LED 501 is a blue LED that emits light around a wavelength of 385 nm, and the second LED 502 is an ultraviolet LED that emits ultraviolet light around a wavelength of 340 nm. Furthermore, around the first LED 501, there is provided a phosphor 506 that converts the excitation light from the first LED 501 into broadband light with wavelengths ranging from 370 nm to 800 nm.

Additionally, the light source 301 of the present embodiment has a dichroic filter 507 that is incident at an angle of 45° on the direct light path of the first LED 501. Moreover, the light source 301 has a reflective plate 508, like a mirror, incident at an angle of 45° on the direct light path of the second LED 502. The ultraviolet light from the second LED 502, reflected by the reflective plate 508, is again reflected by the dichroic filter 507. Together with the light of 370 nm to 800 nm, which is wavelength-converted by the phosphor 506 due to the excitation light of the first LED 501, the ultraviolet light is emitted from the light source 301 as synthesized light on a single light path. As a result, it is possible to obtain light of a wide bandwidth wavelength of 340 nm to 800 nm desired for the automatic analyzer. The method of light synthesis illustrated in FIG. 3 is just one example, and methods such as exchanging the positions of the dichroic filter 507 and the reflective plate 508, using another reflective plate, and using a light rod to mix the light of the two LEDs are conceivable.

The substrate 503 has the role of supplying power to the first LED 501 and the second LED 502 and balancing the temperature of the two LEDs and the temperature adjusting unit 504. When supplying power to the two LEDs, short-circuiting the cathode side to reduce the noise difference between the LEDs is also considered. From the viewpoint of promoting heat conduction between the temperature adjusting unit 504 and each LED, it is preferable that the substrate 503 be made of a material with a metal base, such as aluminum or copper. In this way, by mounting the first LED 501 and the second LED 502 on a single metal substrate 503 with a high thermal conductivity, common temperature fluctuation characteristics can be obtained by the temperature control of the temperature adjusting unit 504. That is, the temperatures of the first LED 501 and the second LED 502 can be relatively easily controlled by the temperature adjusting unit 504.

However, in the light source 301 of the present embodiment, the phosphor 506 that converts the excitation light of the first LED 501 into broadband light and emits the light is provided on the substrate 503 so as to cover the first LED 501. Unlike the first LED 501, it is not easy to adjust the temperature of this phosphor 506 with only the temperature adjusting unit 504. Therefore, according to the present embodiment, a temperature sensor 505 is embedded in the phosphor 506 along with the first LED 501. By doing this, the temperature of the phosphor 506 can be directly measured, making it easier to control the temperature including the phosphor 506, enabling the stabilization of the amount of light over a wide wavelength band. Furthermore, the temperature sensor 505 can be, for example, a thermistor, a thermocouple, a temperature-sensitive resistor, a semiconductor sensor, and the like. Also, it is conceivable to short-circuit the ground side of the temperature sensor 505 and the cathode side of the LED to reduce the noise difference between the temperature sensor 505 and the LED.

For the temperature adjusting unit 504, for example, a metal block with a constant temperature fluid or a Peltier element is used. In the case of the Peltier element, by feedback control of the temperature sensor 505 through the control circuit 201, the substrate 503 side of the temperature adjusting unit 504 can be controlled with high accuracy, for example, to about 37±0.01° C. At this time, it is desirable to dispose the temperature sensor 505 near the target LED element to improve control accuracy. However, since the light source 301 of the present embodiment has the first LED 501 and the second LED 502 provided on the same substrate 503, it is possible to perform control with one temperature sensor 505 by installing the temperature sensor 505 between these two LEDs. As a result, the amount of the emitted light wavelength-converted by the phosphor 506 due to the excitation light of the first LED 501 and the amount of the emitted light from the second LED 502 are likely to have common fluctuation characteristics.

FIG. 4 is a plan view illustrating an example of an arrangement of temperature sensors. First, under the displacement restrictions of optical components such as dichroic filters, mirrors, and lenses, the positions of the first LED 501 and the second LED 502 on the substrate 503 are determined. Subsequently, the position of the temperature sensor 505 is determined based on the balance between the amount of heat from the first LED 501 and the amount of heat from the second LED 502. Specifically, the temperature sensor 505 is disposed closer to the LED with a larger amount of heat in the two LEDs. Ideally, when the amount of heat by the first LED 501 is Q1, the amount of heat by the second LED 502 is Q2, the center position of the first LED 501 is O1, the center position of the second LED 502 is O2, and the center distance is L, the temperature sensor 505 is disposed at the position divided by the ratio of Q2:Q1 from O1 to O2. However, it is assumed that the thermal conductivity of the substrate 503 is high enough for the heat generation by the first LED 501 and the heat generation by the second LED 502 to easily reach a thermal equilibrium state. In this way, the position where the temperature sensor 505 is disposed is close to the temperature center of gravity, that is, the position corresponding to the average temperature of the light source 301, which is a structure including each LED and its mounting substrate. Therefore, by feeding back this average temperature to the temperature adjusting unit 504, such as a Peltier element, through the control circuit 201, it is possible to accurately control the temperature of the light source 301 as a whole, and the amount of light becomes stable. Furthermore, in the present embodiment, although a light source with two LEDs is described, even in a light source with three or more LEDs, the temperature sensor only has to be disposed in a location that takes into account the ratio of the amount of heat of each LED, as described above.

Next, the experimental results when stabilizing the amount of light using the light source of the present embodiment will be described. As experimental conditions, a blue LED with a central wavelength of 385 nm (driven at a current of 600 mA) was used for the first LED 501, and its excitation light made the phosphor 506 emit white light. On the other hand, an ultraviolet light LED with a central wavelength of 340 nm (driven at a current of 160 mA) was used for the second LED 502. In addition, the dichroic filter 507 and the reflective plate 508 were disposed in the same configuration as illustrated in FIG. 3. Furthermore, a Peltier element with a 20 mm×20 mm cooling surface was used for the temperature adjusting unit 504, and the temperature of the cooling surface was controlled to 37±0.01° C. Then, on the aluminum substrate 503 on which each LED was mounted, pattern wiring was applied through an insulating film (resist).

The present experiment was conducted under such conditions to measure the time required to stabilize the amount of light by changing the displacement of the thermistor, which is the temperature sensor 505, (in the comparative example and the first embodiment) for comparison. As a specific indicator, the light amount drift at a single wavelength for ten minutes (how much the amount of light changes in ten minutes) was adopted as an indicator of stable absorbance analysis. Furthermore, the single wavelength is 340 nm, 376 nm, 415 nm, 450 nm, 480 nm, 505 nm, 546 nm, 570 nm, 600 nm, 660 nm, 700 nm, 750 nm, and 800 nm.

FIG. 5 is a plan view illustrating an arrangement of temperature sensors in a light source of a comparative example. As illustrated in FIG. 5, in the light source of the comparative example, the temperature sensor 505 is not embedded in the phosphor 506 and is located outside the phosphor 506, unlike in the first embodiment.

FIG. 6 is a table illustrating a result of measuring the time from a lighting of a LED to a stabilization of the light amount drift. As illustrated in FIG. 6, it can be seen that in the first embodiment, the time taken for the amount of light to stabilize is shorter than in the comparative example. This result suggests that by embedding the temperature sensor 505 in the phosphor 506, the amount of light emitted from the phosphor 506 can be controlled with high precision, leading to faster stabilization of the light intensity.

Here, a light intensity stabilization unit will be described. As described above, to stably obtain the analytical performance of the absorbance analysis of the automatic analyzer, it is preferable for the amount of light of the light source to be constant. In the present embodiment, the unit that keeps the amount of light constant includes temperature control of the substrate 503 by the temperature adjusting unit 504 and control of the LED's driving current.

For example, an AlGaN crystal that is a compound semiconductor, is used as an LED that emits ultraviolet light with a wavelength of 340 nm or less. When an AlGaN crystal is used as the light emitting layer, the luminous efficiency of the ultraviolet LED is as low as a few tenths to a dozen tenths compared to the luminous efficiency of the InGaN crystal used in the light emitting layer of a typical white LED. A characteristic of the AlGaN crystal light emitting layer is that most of the input power is converted into heat. Additionally, as the operating temperature of the LED increases and as the usage time lengthens, defects form in the semiconductor crystal, causing the LED's light intensity to decrease over time. Therefore, LEDs using AlGaN crystals tend to have a shorter lifespan compared to LEDs using InGaN crystals. In commercially available LEDs, the specification value for the time L70, when the light intensity decreases to 70%, is usually defined when used at a package bottom temperature of 25° C. For example, L70 is more than 10,000 hours, but it is known that as the usage temperature increases, L70 becomes shorter according to the Arrhenius model. That is, by lowering the temperature of the substrate on which the LED is mounted using the temperature adjusting unit 504 such as a Peltier element, the light intensity increases, and the LED's lifespan can be extended. Furthermore, the amount of light of the LED can also be increased by increasing the driving current.

FIG. 7 is a flowchart illustrating an example of a procedure for stabilizing an amount of light in the light source according to the first embodiment. As illustrated in FIG. 7, after the automatic analysis device is turned on (Step S601), the light source 301 starts to light up (Step S602). Subsequently, the dispensing mechanism dispenses water into an arbitrary reaction cell 108 (Step S603). Then, the absorbance measuring unit 113, based on the temperature data acquired by the temperature sensor 505, executes the LED driving current control, and temperature control of the substrate 503 by the temperature adjusting unit 504 (Step S604). At this time, the absorbance measuring unit 113 performs absorbance measurement on the reaction cell 108 (Step S605), and determines whether the amount of light that meets the specified value is obtained (Step S606). When the amount of light that meets the specified value is not obtained, the process returns to Step S604, and the absorbance measuring unit 113 executes the LED driving current control and temperature control of the substrate 503 by the temperature adjusting unit 504. Then, when the amount of light that meets the specified value is obtained in Step S606, the absorbance analysis is started (Step S607).

The absorbance measuring unit 113 is controlled by the control circuit 201, and the light intensity data of the light intensity measuring circuit 202 is acquired from the information recording unit 2031. Furthermore, as for temperature data, temperatures measured by, not only the temperature sensor 505 embedded in the phosphor 506 but also another temperature sensor not embedded in the phosphor 506, for example, a temperature sensor that measures the installation environment temperature of the automatic analyzer, may be used.

Second Embodiment

In a second embodiment, as a unit that keeps the amount of light constant, in addition to the temperature control of a substrate 503 by a temperature adjusting unit 504 and the LED driving current control, there is also heating control of a phosphor 506 by a heater 601. When the overall temperature control of a light source 301, specifically the temperature control of the phosphor 506, is not sufficient with only the LED driving current control or the temperature adjusting unit 504, such as a Peltier element, the present embodiment is particularly effective. Furthermore, as for the type of heater 601, for example, rubber heaters, film heaters, cartridge heaters, sheath heaters, and the like, can be named.

FIG. 8 is a cross-sectional view illustrating a configuration of a light source according to a second embodiment. As illustrated in FIG. 8, the light source 301 according to the present embodiment includes the substrate 503, the temperature adjusting unit 504 that adjusts the temperature of this substrate 503, a first LED 501 and a second LED 502 that are mounted on the opposite side of this substrate 503 from the temperature adjusting unit 504, and the heater 601 that can directly heat the phosphor 506. Therefore, by feeding back the temperature data acquired by a temperature sensor 505 to the control of the heater 601, the time it takes to stabilize the amount of light after the LED lights up can be shortened.

Furthermore, after the automatic analyzer operates for a certain period, the amount of light of the light source 301 becomes stable, so the temperature data at this time is measured by the temperature sensor 505 and is pre-recorded in an information recording unit 2031. Therefore, heating the phosphor 506 to that temperature with the heater 601 makes it possible to stabilize the amount of light efficiently. Especially when the phosphor 506 is heated (pre-heated) by the heater 601 before the LED starts lighting up, the time it takes to stabilize the amount of light is further shortened.

FIG. 9 is a flowchart illustrating an example of a procedure for stabilizing an amount of light in the light source according to the second embodiment. First, the automatic analyzer is started (Step S701). Subsequently, based on the data acquired by the temperature sensor 505, initial values for the LED driving current value, the temperature setting value of the temperature adjusting unit 504 that controls the temperature of the substrate 503, and the temperature setting value of the heater 601 that pre-heats the phosphor 506 are determined (Step S702). Subsequently, the light source starts to light up (Step S703), and the absorbance measuring unit 113, based on the temperature data acquired by the temperature sensor 505, executes the LED driving current control, temperature control of the substrate 503 by the temperature adjusting unit 504, and temperature control of the phosphor 506 by the heater 601 (Step S704). Here, an analysis unit 2032 analyzes the temporal data change of the temperature acquired by the temperature sensor 505 in Step S705 and the temporal change of the absorbance (light intensity) measured by the absorbance measuring unit 113 in Step S706. Then, in Step S707, when the absorbance measuring unit 113 determines that it is not the amount of light that meets the specified value, the LED driving current value, the temperature setting value of the temperature adjusting unit 504, and the temperature setting value of the heater 601 are adjusted based on the analysis results of the analysis unit 2032. On the other hand, when in Step S707, the absorbance measuring unit 113 determines that it is the amount of light that meets the specified value, the absorbance analysis is started (Step S708).

For example, when adjusting the temperature setting value of the temperature adjusting unit 504, which is a Peltier element, using PID control based on the analysis results of the analysis unit 2032, the PID parameters are determined using the temperature data measured by the temperature sensor 505. Here, when the environmental temperature is 25° C. and the temperature setting value (target value) of the temperature adjusting unit 504 is 37° C., it takes time to stabilize the amount of light at a temperature control with 37° C. as the target. Therefore, when the temporal data change of the temperature is gentle (i.e., it seems to take time to stabilize the amount of light), for example, temperature control with a PID parameter with 42° C. as the target may be preferable. In this way, by acquiring and analyzing the temporal data change of the temperature in real-time, it is possible to shorten the time it takes to stabilize the amount of light.

It should be noted that the present invention is not limited to the examples described above, and includes various modification examples. For example, the examples described above have been described in detail to simply describe the present invention, and are not necessarily required to include all the described configurations. In addition, part of the configuration of one example can be replaced with the configurations of other examples, and in addition, the configuration of the one example can also be added with the configurations of other examples. In addition, part of the configuration of each of the examples can be subjected to addition, deletion, and replacement with respect to other configurations.

REFERENCE SIGNS LIST

101: sample
102: sample cup
103: sample disk
104: reagent
105: reagent bottle
106: reagent disk
107: reaction solution
108: reaction cell
109: reaction disk
110: sample dispensing mechanism
111: reagent dispensing mechanism
112: stirrer
113: absorbance measuring unit
114: cleaning unit
115: constant temperature fluid
201: control circuit
202: light intensity measuring circuit
203: data processing unit
2031: information recording unit
2032: analysis unit
204: input unit
205: output unit
301: light source
302: spectroscope
3021: diffraction grating
3022: detector array
401: optical axis
402: light source side slit
403: condensing lens
404: spectrometer side slit
501: first LED
502: second LED
503: substrate
504: temperature adjusting unit
505: temperature sensor
506: phosphor
507: dichroic filter
508: reflective plate
601: heater

The invention claimed is:

1. A light source comprising:
a substrate;
a first LED provided on the substrate;
a phosphor that converts an excitation light of the first LED into a wideband light; and
a distinct second LED provided on the substrate,
wherein: a temperature sensor is embedded in the phosphor together with the first LED; and
the first LED is embedded in the phosphor and the second LED is not embedded in the phosphor; and
the temperature sensor is configured to be disposed between the first LED and the distinct second LED, the temperature sensor being configured to be disposed so as to be closer to any one of the first LED and the second LED, whichever is configured to have a larger amount of heat.

2. The light source according to claim 1, further comprising a heater for heating the phosphor.

3. The light source according to claim 2, wherein the phosphor is heated by the heater before the first LED is turned on.

4. A light source comprising:

a substrate;

a first LED provided on the substrate;

a phosphor that converts an excitation light of the first LED into a wideband light; and a heater configured to heat the phosphor; and wherein the heater is directly coupled to the phosphor;

a temperature adjusting unit on a side opposite to the first LED with respect to the substrate, wherein:

a temperature sensor is embedded in the phosphor together with the first LED; and the first LED, the heater, and the temperature adjusting unit are configured to be controlled by using a temperature measured by the temperature sensor.

5. The light source according to claim 4, comprising an environmental temperature sensor which is not embedded in the phosphor, separately from the temperature sensor, wherein the first LED, the heater, and the temperature adjusting unit are controlled by using a temperature measured by the temperature sensor and the environmental temperature sensor.

6. The light source according to claim 4, wherein the first LED, the heater, and the temperature adjusting unit are controlled according to a change over time in temperature measured by the temperature sensor.

7. An automatic analyzer comprising:

an absorbance measuring unit having the light source according to claim 1; and a reaction disk on which a reaction vessel for containing a reaction solution measured by the absorbance measuring unit is mounted.

* * * * *